United States Patent
Ichimura (10) Patent No.: US 11,063,422 B2
(45) Date of Patent: Jul. 13, 2021

(54) POWER SEMICONDUCTOR MODULE AND POWER CONVERTER

(71) Applicant: Mitsubishi Electric Corporation, Tokyo (JP)

(72) Inventor: Toru Ichimura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 217 days.

(21) Appl. No.: 16/137,655

(22) Filed: Sep. 21, 2018

(65) Prior Publication Data
US 2019/0157859 A1    May 23, 2019

(30) Foreign Application Priority Data

Nov. 22, 2017  (JP) .............................. JP2017-224932

(51) Int. Cl.
*H02H 7/122*        (2006.01)
*H03K 17/18*        (2006.01)
(Continued)

(52) U.S. Cl.
CPC .............. *H02H 7/122* (2013.01); *H02M 1/32* (2013.01); *H03K 17/0828* (2013.01);
(Continued)

(58) Field of Classification Search
CPC ........... H02H 7/122; H02H 3/16; H02M 7/48; H02M 1/32; H02M 7/5387; H02M 1/08;
(Continued)

(56) References Cited

U.S. PATENT DOCUMENTS 5,869,996 A    2/1999  Okumura
8,779,929 B2 * 7/2014  Komatsu ................ H03K 17/18
                                            340/653
(Continued)

FOREIGN PATENT DOCUMENTS

CN        105264757 A    1/2016
JP        H08-098505 A   4/1996
(Continued)

OTHER PUBLICATIONS

An Office Action; "Notice of Reasons for Refusal", mailed by the Japanese Patent Office dated Sep. 29, 2020, which corresponds to Japanese Patent Application No. 2017-224932 and is related to U.S. Appl. No. 16/137,655; with English language translation.
(Continued)

*Primary Examiner* — Danny Nguyen
(74) *Attorney, Agent, or Firm* — Studebaker & Brackett PC (57) ABSTRACT

A power semiconductor module includes a power semiconductor element; a control circuit which controls the power semiconductor element; and multiple terminals. The control circuit deactivates a gate terminal, which is a control electrode of the power semiconductor element, in an event of a fault in the power semiconductor element or the power semiconductor module, and outputs from a first output terminal a fault signal indicating the event of the fault in the power semiconductor module. When there is no fault in the power semiconductor element and the power semiconductor module, the control circuit uses the first output terminal for other applications such as for outputting temperature information on the power semiconductor module, for example. This allows the fault signal to be output without increasing the number of terminals of the power semiconductor module more than necessary.

12 Claims, 7 Drawing Sheets

(51) Int. Cl.
*H02M 1/32* (2007.01)
*H03K 17/082* (2006.01)
*H02P 27/08* (2006.01)
*H02M 7/48* (2007.01)
*H02P 27/06* (2006.01)
*H02P 29/024* (2016.01)
*H02M 1/08* (2006.01)

(52) U.S. Cl.
CPC .............. *H03K 17/18* (2013.01); *H02M 1/08* (2013.01); *H02M 7/48* (2013.01); *H02P 27/06* (2013.01); *H02P 27/08* (2013.01); *H02P 29/024* (2013.01); *H03K 2217/0027* (2013.01)

(58) Field of Classification Search
CPC ...... G08B 19/00; H03K 7/08; H03K 17/0828; H03K 17/18; H03K 17/082; H03K 3/011
USPC .................................. 361/86–87, 93.7–93.9
See application file for complete search history.

(56) References Cited

U.S. PATENT DOCUMENTS

| | | | |
|---|---|---|---|
| 2012/0146782 A1 | 6/2012 | Komatsu et al. | |
| 2014/0009983 A1* | 1/2014 | Nakamori | H03K 17/0828 363/50 |
| 2015/0180227 A1* | 6/2015 | Sekigawa | H02H 9/04 361/88 |
| 2016/0118974 A1* | 4/2016 | Terasawa | H02H 3/16 361/93.8 |
| 2017/0019092 A1* | 1/2017 | Taoka | H03K 17/082 |

FOREIGN PATENT DOCUMENTS

| | | |
|---|---|---|
| JP | 2012-143125 A | 7/2012 |
| JP | 2014-103820 A | 6/2014 |
| WO | 2015/076014 A1 | 5/2015 |
| WO | 2016/052011 A1 | 4/2016 |

OTHER PUBLICATIONS

An Office Action issued by the State Intellectual Property Office of the People's Republic of China dated May 28, 2020, which corresponds to Chinese Patent Application No. CN 201811366608.0.

An Office Action mailed by the State Intellectual Property Office of the People's Republic of China dated Dec. 1, 2020, which corresponds to Chinese Patent Application No. 201811366608.0 and is related to U.S. Appl. No. 16/137,655; with English language translation.

* cited by examiner

EXAMPLE 1 OF IDENTIFICATION (IDENTIFICATION OF PULSE WIDTH)

FIG.12

EXAMPLE 2 OF IDENTIFICATION (IDENTIFICATION OF PWM MODULATION FACTOR)

POWER SEMICONDUCTOR MODULE AND POWER CONVERTER

BACKGROUND OF THE INVENTION

Field of the Invention

The present disclosure relates to power semiconductor modules, and particularly, to a power semiconductor module configured to output a fault signal indicating a fault such as overcurrent, and a power converter which includes the power semiconductor module.

Description of the Background Art

Breakdown of a power semiconductor device affects peripheral circuits, and can have significant impact on the use environment. For this reason, it is necessary to observe the status of the power semiconductor device, and sense an abnormal operation of the power semiconductor device.

For this purpose, current, control power supply voltage, and temperature of the power semiconductor device are monitored, and the power semiconductor device is shut down based on the monitoring information, and the monitoring information, the event of the shutdown, etc. are informed.

Some power semiconductor modules are used in devices such as inverter devices, and are configured to detect abnormal conditions and output a fault signal corresponding to the detected abnormal conditions.

Japanese Patent Laying-Open No. H8-98505 discloses a semiconductor composite element which detects abnormal conditions, including an overcurrent fault, a control power supply voltage drop fault, and an overheat fault, and outputs a fault signal that varies corresponding to the detected fault. The semiconductor composite element includes: an abnormal conditions detector which detects overcurrent faults, control power supply voltage drop faults, and overheat faults of multiple semiconductor switching elements; and a fault signal generator which generates a fault signal that varies corresponding to the fault detected by the abnormal conditions detector.

The semiconductor composite element disclosed in Japanese Patent Laying-Open No. H8-98505 is provided with an output terminal dedicated for outputting the fault signals. This leads to an increased number of input and output terminals.

SUMMARY OF THE INVENTION

The present disclosure is made to overcome, for example, the increase in the number of input and output terminals as mentioned above, and has an object to output the fault signal without increasing the number of terminals of a power semiconductor module more than necessary.

The present disclosure relates to a power semiconductor module. The power semiconductor module includes a power semiconductor element, a control circuit configured to control the power semiconductor element, and a first terminal. The control circuit deactivates a control electrode of the power semiconductor element in an event of a fault in the power semiconductor element or power semiconductor module, and outputs from the first terminal a fault signal indicating the event of the fault in the power semiconductor module. The control circuit uses the first terminal for other applications when there is no fault in the power semiconductor element and power semiconductor module.

According to the present disclosure, the terminal for outputting fault signals is used for other applications when there is no fault, thereby allowing fault signals to be output, without increasing the number of terminals of the power semiconductor module more than necessary.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, embodiments according to the present disclosure are described, with reference to the accompanying drawings. Note that the same or corresponding reference signs are used to refer to the same or corresponding parts in the following drawings, and description thereof will not be repeated.

For ease of understanding of the embodiments, two considered examples are first described.

Figure 1:
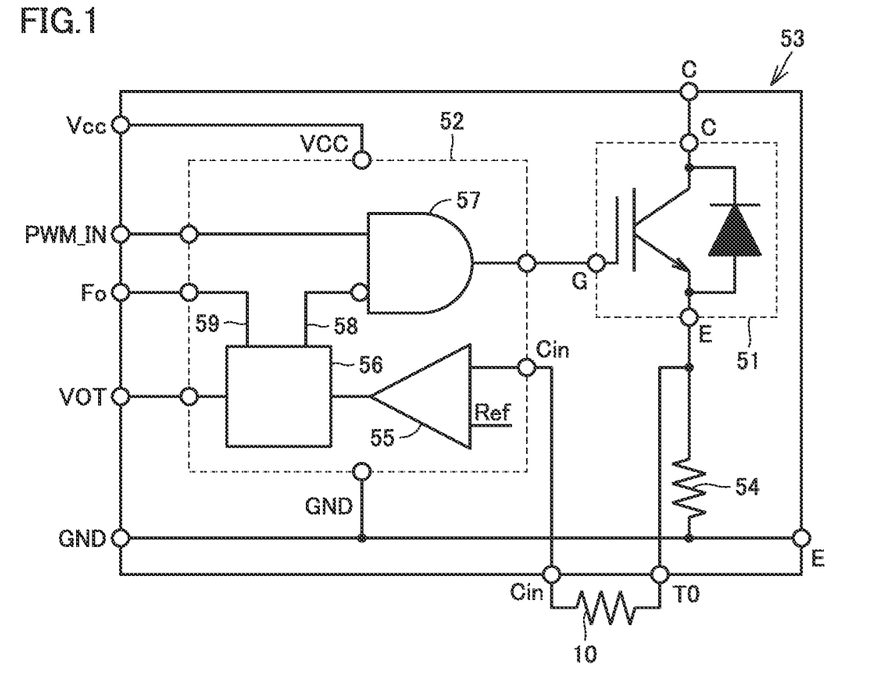
FIG. 1 is an equivalent circuit diagram illustrating a configuration of a power semiconductor module according to Considered Example 1.

FIG. 1 is an equivalent circuit diagram illustrating a configuration of a power semiconductor module according to Considered Example 1. Referring to FIG. 1, a power semiconductor module 53 includes a power semiconductor device 51 and a control circuit 52. Power semiconductor device 51 has a gate terminal G connected to and driven by a gate driver 57 included in control circuit 52.

Control circuit 52 has input terminals, including a terminal PWM_IN for controlling power semiconductor device 51, and a terminal Cin for receiving information for blocking power semiconductor device 51 and shutting down the power semiconductor module 53. Control circuit 52 has output terminals, including a terminal VOT for outputting a temperature of power semiconductor module 53, and a terminal Fo for outputting a fault recognized by control circuit 52.

Terminal Cin is used primarily for the purpose of detecting overcurrent in power semiconductor device 51, and is connected to an emitter terminal E of power semiconductor device 51 through a resistor 10, the emitter terminal E being connected to a shunt resistor 54. Current through power semiconductor device 51 is input to terminal Cin, as a voltage of shunt resistor 54.

Terminal Cin is connected to a comparator 55 in control circuit 52. Voltage of terminal Cin is compared with an internal reference voltage Ref. If the voltage of terminal Cin exceeds internal reference voltage Ref, comparator 55 outputs a signal indicating the overcurrent to a protection circuit block 56. Protection circuit block 56 receives a signal for monitoring or protecting power semiconductor module 53, such as a signal indicating a temperature of power semiconductor module 53, a control power supply voltage VCC, etc., as well as the signal indicating the overcurrent. The temperature information is processed in protection circuit block 56 and output to terminal VOT. When it is determined that an abnormal operation, such as overcurrent, overheat, or a drop in control power supply voltage, has occurred, protection circuit block 56 sends an output blockage signal 58 to gate driver 57 and outputs a fault signal (signal Fo) 59 to terminal Fo.

Figure 2:
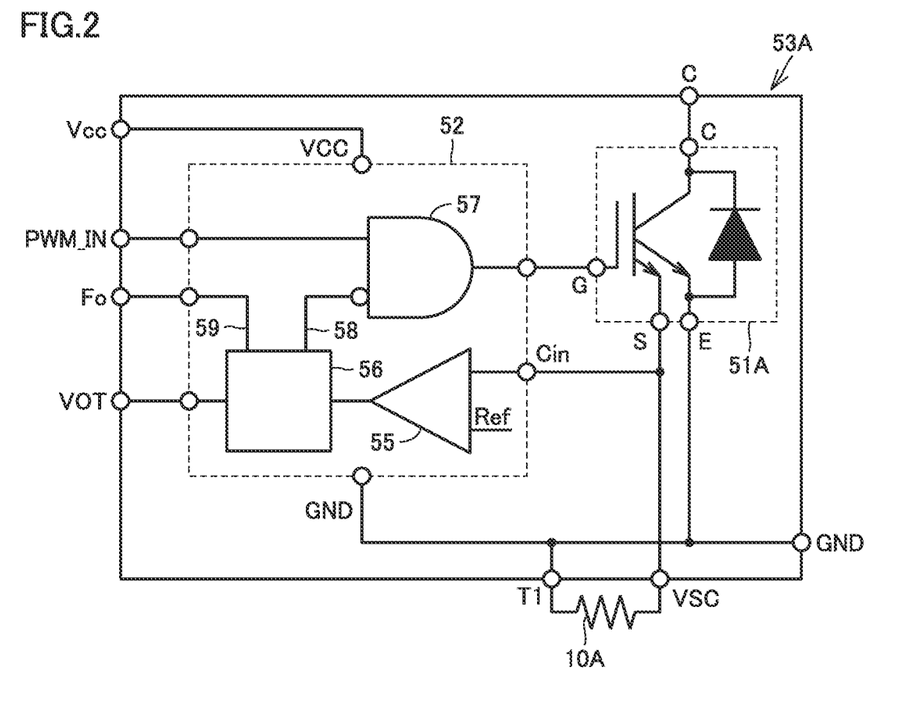
FIG. 2 is an equivalent circuit diagram illustrating a configuration of a power semiconductor module according to Considered Example 2.

FIG. 2 is an equivalent circuit diagram illustrating a configuration of a power semiconductor module according to Considered Example 2. Referring to FIG. 2, a power semiconductor module 53A includes a power semiconductor device 51A and a control circuit 52. Power semiconductor device 51A has a gate terminal G connected to and driven by a gate driver 57 included in a control circuit 52.

Power semiconductor device 51A has an emitter terminal E and a sense terminal S. A small current known as a sense current corresponding to a current through the emitter flows through sense terminal S. Sense terminal S is connected to a sense resistor 10A. Emitter current through power semiconductor device 51A can be monitored indirectly by monitoring the sense current. The sense current is input to a terminal Cin of control circuit 52, as a voltage of sense resistor 10A.

Terminal Cin is connected to a comparator 55 in control circuit 52. Voltage of terminal Cin is compared with an internal reference voltage Ref. Output of comparator 55 is activated and input to a protection circuit block 56 when the voltage of terminal Cin exceeds internal reference voltage Ref.

In addition to a signal indicating overcurrent, protection circuit block 56 receives a signal for monitoring or protecting power semiconductor module 53A, such as a signal indicating a temperature of power semiconductor module 53A, a control power supply voltage VCC, etc. Temperature information is processed in protection circuit block 56 and output to terminal VOT. When it is determined that an abnormal operation, such as overcurrent, overheat, or a drop in control power supply voltage, has occurred, protection circuit block 56 sends an output blockage signal 58 to gate driver 57 and outputs a fault signal 59 to a terminal Fo.

In Considered Examples in FIGS. 1 and 2, terminal Fo is dedicated for outputting the fault signal, and thus the power semiconductor module has a large number of terminals as a whole. Preferably, the terminal for outputting the fault signal is shared with terminals of the power semiconductor module intended for other purposes, to reduce the number of terminals of the power semiconductor module.

Embodiment 1

Configuration

Figure 3:
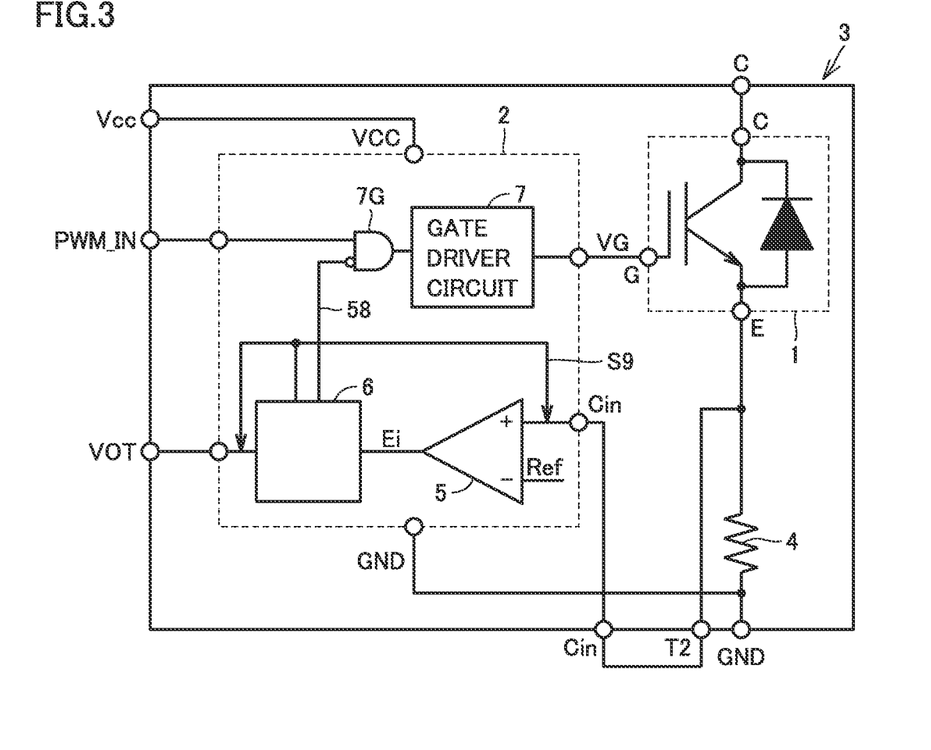
FIG. 3 is an equivalent circuit diagram illustrating a configuration of a power semiconductor module according to Embodiment 1.

FIG. 3 is an equivalent circuit diagram illustrating a configuration of a power semiconductor module according to Embodiment 1. A power semiconductor module 3 shown in FIG. 3 includes a power semiconductor element 1, a control circuit 2 which controls power semiconductor element 1, and terminals VOT, Vcc, PWM_IN, Cin, GND, and T2.

Power semiconductor element 1 includes, for example, an insulated gate bipolar transistor (IGBT) element, and a freewheeling diode connected between the collector and emitter of the IGBT element. Power semiconductor element 1 may include a metal-oxide-semiconductor field-effect transistor (MOSFET) or a bipolar transistor, instead of the IGBT element. Power semiconductor element 1 may also be an IGBT having the sense terminal used in FIG. 2 or a thyristor, for example.

In the event of a fault in power semiconductor element 1 or power semiconductor module 3, control circuit 2 deactivates gate terminal G which is a control electrode of power semiconductor element 1, and outputs, from terminal VOT, a fault signal S9 indicating the event of the fault in power semiconductor module 3. If there is no fault in power semiconductor element 1 and power semiconductor module 3, control circuit 2 uses terminal VOT for other applications, such as for outputting the temperature information, for example.

Control circuit 2 includes a comparator 5, a protection circuit block 6, a cutoff gate 7G, and a gate driver circuit 7. By connecting terminals Cin and T2, the potential at the emitter of power semiconductor element 1 is input to input terminal Cin of control circuit 2.

Terminal Cin is connected to comparator 5 in control circuit 2. Comparator 5 compares a voltage of terminal Cin with an internal reference voltage Ref. If the voltage of terminal Cin exceeds internal reference voltage Ref, output of comparator 5 is activated and a signal Ei indicating overcurrent is input to protection circuit block 6. As signal Ei indicating the overcurrent is input to protection circuit block 6, protection circuit block 6 outputs fault signal (signal Fo) S9 for power semiconductor module 3 to the input terminal (Cin) for detecting overcurrent, and the output terminal (VOT) for temperature information, as indicated by the arrows.

Figure 4:
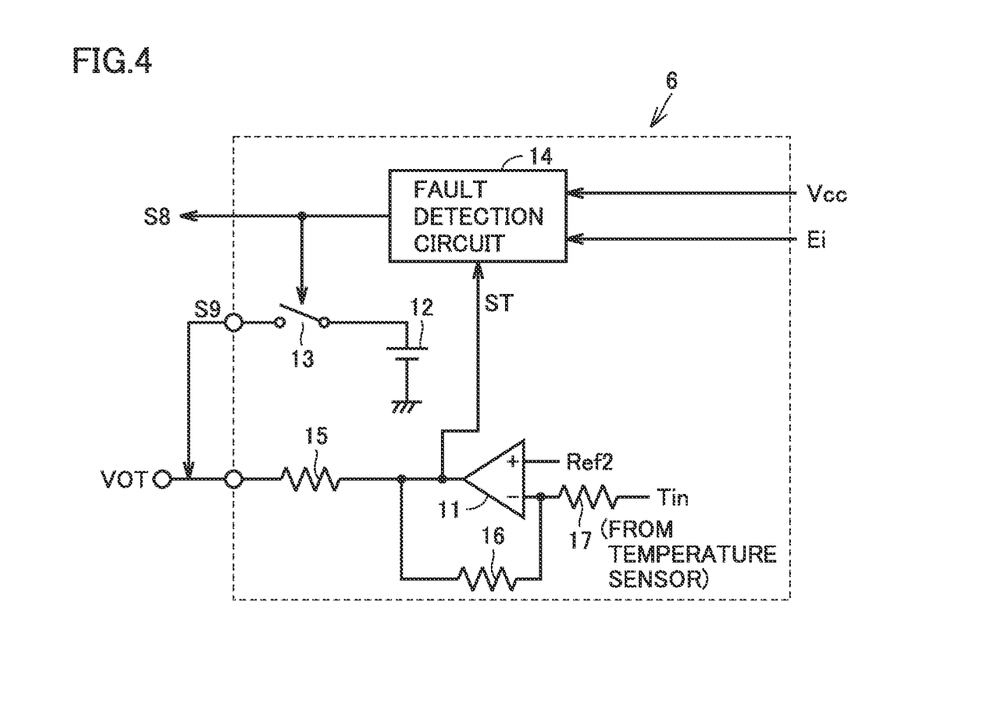
FIG. 4 is an equivalent circuit diagram illustrating a configuration of a protection circuit block according to Embodiment 1.

FIG. 4 is an equivalent circuit diagram illustrating a configuration of protection circuit block 6. Protection circuit block 6 includes an operational amplifier 11, a direct-current (DC) power supply 12, a switch 13, a fault detection circuit 14, and resistors 15, 16, and 17.

In addition to signal Ei indicating overcurrent, fault detection circuit 14 included in protection circuit block 6 receives a signal for monitoring or protecting power semiconductor module 3, such as a signal ST indicating a temperature of power semiconductor module 3, control power supply Vcc, etc. Operational amplifier 11 processes a voltage that is based on a temperature input from a temperature sensor (not shown) connected to a terminal Tin, and outputs temperature information to terminal VOT. Operational amplifier 11 inversely amplifies voltage of the temperature sensor (e.g., a temperature sensor can be used which has negative temperature characteristics making use of a diode forward voltage drop) from terminal Tin, using a reference voltage Ref2 as a reference, and outputs the inversely amplified voltage from terminal VOT. In other words, a higher analog voltage is output from terminal VOT with an increase in temperature of power semiconductor module 3. When it is determined that an abnormal operation, such as overcurrent, overheat, a drop in control power supply voltage, etc., has occurred, fault detection circuit 14 included in protection circuit block 6 sends an output blockage signal S8 to cutoff gate 7G and causes switch 13 to conduct to output fault signal S9.

Operational amplifier 11 has relatively high output impedance. In contrast, DC power supply 12 has sufficiently low output impedance.

Figure 5:
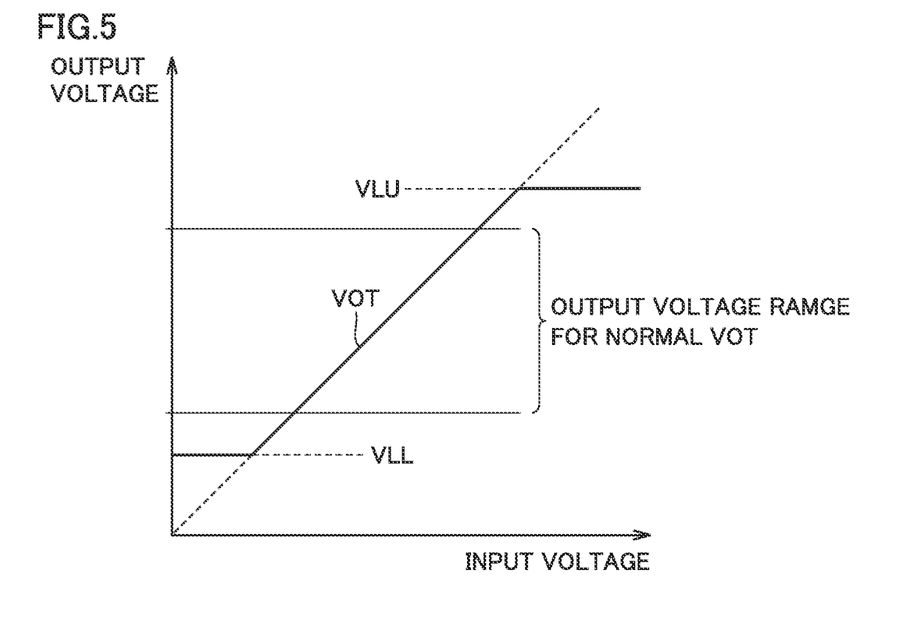
FIG. 5 is a diagram showing input voltage versus output voltage of an operational amplifier 11 according to Embodiment 1.

FIG. 5 is a diagram showing input voltage versus output voltage of operational amplifier 11. Signal ST output from operational amplifier 11 is recognized as an analog voltage signal outside the power semiconductor module 3. As shown in FIG. 5, the output range of signal ST is limited by a limiter. Specifically, an upper limit of the output voltage of operational amplifier 11 is limited to a voltage VLU, and a lower limit of the output voltage of operational amplifier 11 is limited to a voltage VLL. An output voltage range of normal terminal VOT resides between the upper limit and the lower limit. A normal range is defined for normal temperature detection voltage, and the voltage of signal S9 is one that operational amplifier 11 is unable to output or one that falls within an abnormal range of operational amplifier 11. Application of this voltage with low impedance to terminal VOT can avoid collision of the temperature detection signal and the fault signal, allowing the temperature detection signal and the fault signal to be securely output from one terminal VOT. In the example shown in FIG. 5, signal S9 has a voltage range above the output range of normal VOT.

However, the temperature detection signal and the fault signal can be output from one terminal VOT even if the voltage range of signal S9 is below the output range of normal VOT.

In other words, as shown in FIGS. 3 to 4, the terminal which outputs the fault signal is the terminal which outputs an analog signal which is an output of the operational amplifier, and control circuit 2 applies to the analog signal terminal the fault signal as an analog value.

Note that signal S9 is not limited to either high active or low active. Particularly when the input and output terminals and the fault signal output terminal are shared, the polarity of high/low logic for signal S9 may be chosen so as not to impede the functionalities required in the input and output terminals.

Figure 6:
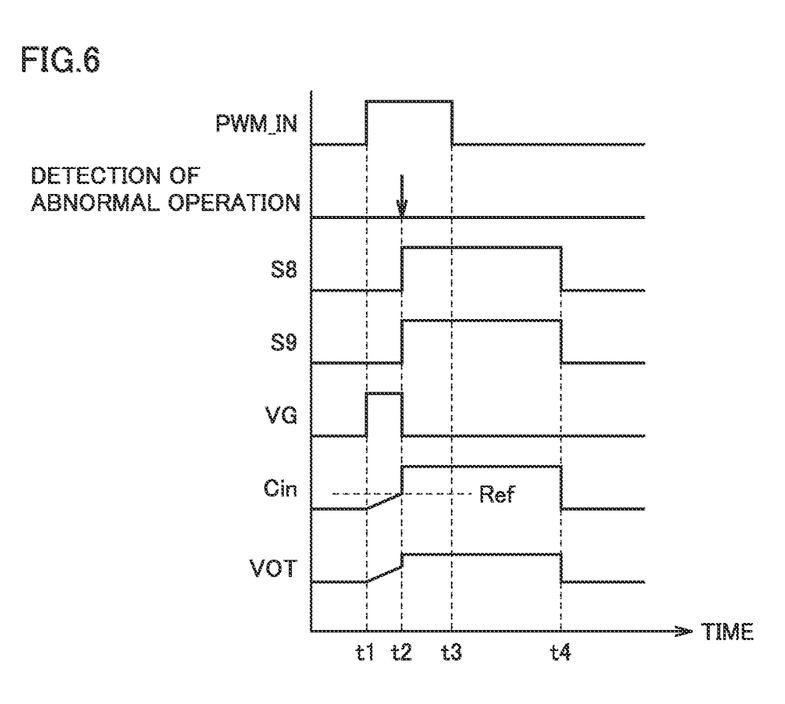
FIG. 6 is a waveform diagram for illustrating an operational sequence of the power semiconductor module according to Embodiment 1.

FIG. 6 is a waveform diagram for illustrating operational sequence of power semiconductor module 3 according to Embodiment 1. Referring to FIG. 6, as the input signal PWM_IN changes from low to high at time t1, a gate voltage VG is activated. Here, at time t2, the potential at terminal Cin exceeds voltage Ref, in response to which an abnormal operation (overcurrent) is detected. As the abnormal operation is detected, protection circuit block 6 changes output blockage signal S8 and abnormal operation signal S9 from low to high. In response, gate voltage VG is deactivated (changed to low), and a voltage exceeding upper limit VLU of output of operational amplifier 11 in FIG. 5 is output from terminal VOT. At time t3, even though input signal PWM_IN changes from high to low, output blockage signal S8 and abnormal operation signal S9 are kept activated (high) until the fault is overcome or the power supply voltage is turned off.

As described above, power semiconductor module 3 according to Embodiment 1 outputs fault signal S9 to terminal Cin which is an input terminal, or terminal VOT which is an output terminal for the temperature information. This allows the fault signal to be output so that the abnormal operation is recognizable at an external circuit, without impeding the I/O capabilities of terminal Cin and terminal VOT. Thus, a terminal dedicated for outputting the fault signals can be eliminated.

Embodiment 2

In Embodiment 1, fault signal S9 and output blockage signal S8 are generated based on the same signal. In Embodiment 2, a fault signal S9 is output longer than an output blockage signal S8, thereby facilitating the detection of abnormal conditions of the power semiconductor module according to the present disclosure.

Figure 7:
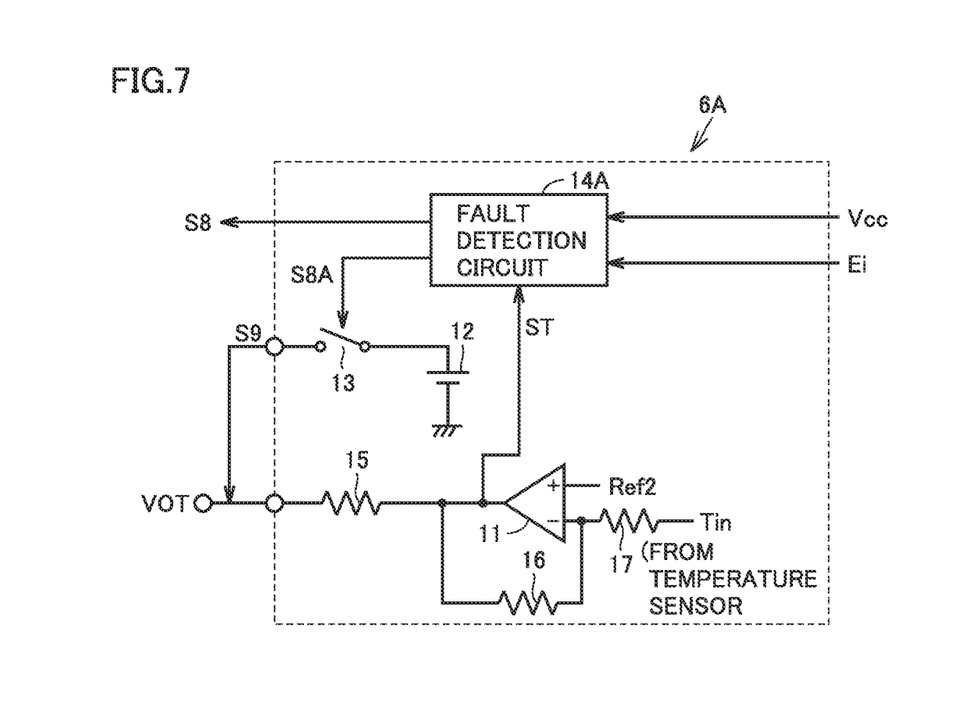
FIG. 7 is a circuit diagram illustrating a configuration of a protection circuit block 6A according to Embodiment 2.

FIG. 7 is a circuit diagram illustrating a configuration of a protection circuit block 6A according to Embodiment 2. Protection circuit block 6A shown in FIG. 7 includes a fault detection circuit 14A, instead of fault detection circuit 14 in the configuration of protection circuit block 6 shown in FIG. 4.

Fault detection circuit 14A outputs a signal S8A for causing switch 13 to conduct, in addition to blockage signal S8. Fault detection circuit 14A outputs a fault signal S8A longer than output blockage signal S8.

Figure 8:
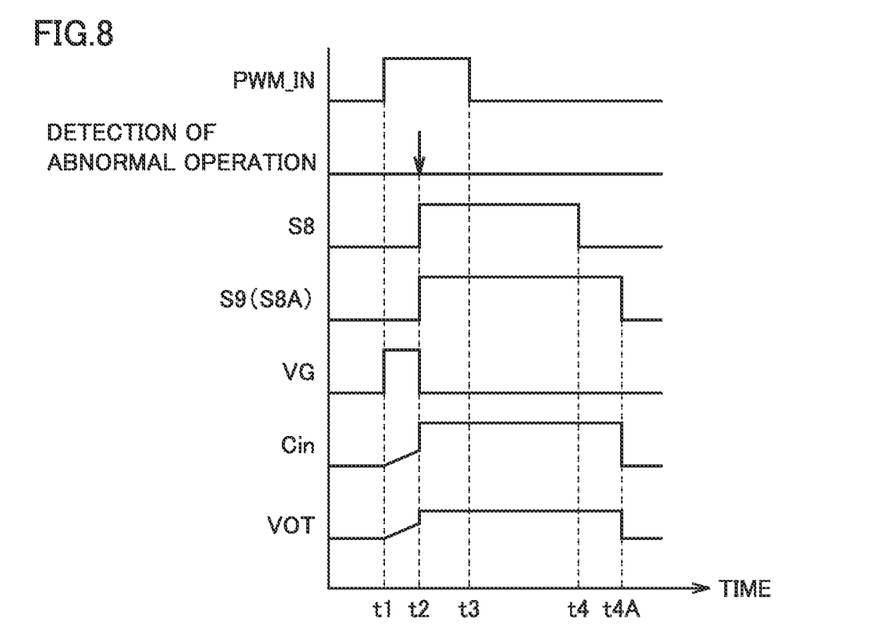
FIG. 8 is a waveform diagram illustrating an operation of a power semiconductor module according to Embodiment 2.

FIG. 8 is a waveform diagram illustrating an operation of a power semiconductor module according to Embodiment 2. Operations at times t1 to t3 in FIG. 8 are the same as those in FIG. 6, and thus description thereof will not be repeated. In FIG. 8, fault detection circuit 14A changes output blockage signal S8 from high to low at time t4, at which time an abnormal operation signal S9 (and S8A) is still kept high. Then, at time t4A later than time t4, fault detection circuit 14A changes the abnormal operation signal S9 (and S8A) from high to low.

For example, if a controller for monitoring the power semiconductor module according to Embodiment 2 employs an analog-to-digital converter (AD converter) to detect a fault signal at a terminal VOT, it takes a longer time to recognize the fault than the method for recognizing an edge of logic transition of fault signal S9 as an abnormal condition. On the other hand, it is desirable that output blockage signal S8 is controlled so that the output is blocked as short as possible.

The method of controlling output blockage signal S8 and abnormal operation signal S9 according to the sequence described in Embodiment 2 is particularly effective in such a case, and can secure processing time for the AD converter, for example.

Embodiment 3

In Embodiment 2, fault signal S9 is output longer than output blockage signal S8. However, in Embodiment 3, a fault signal S9 is output shorter than an output blockage signal S8, thereby reducing power consumption of the power semiconductor module according to the present disclosure.

While protection circuit block 6A in FIG. 7 may be employed in Embodiment 3, fault detection circuit 14A outputs a fault signal S8A shorter than output blockage signal S8.

Figure 9:
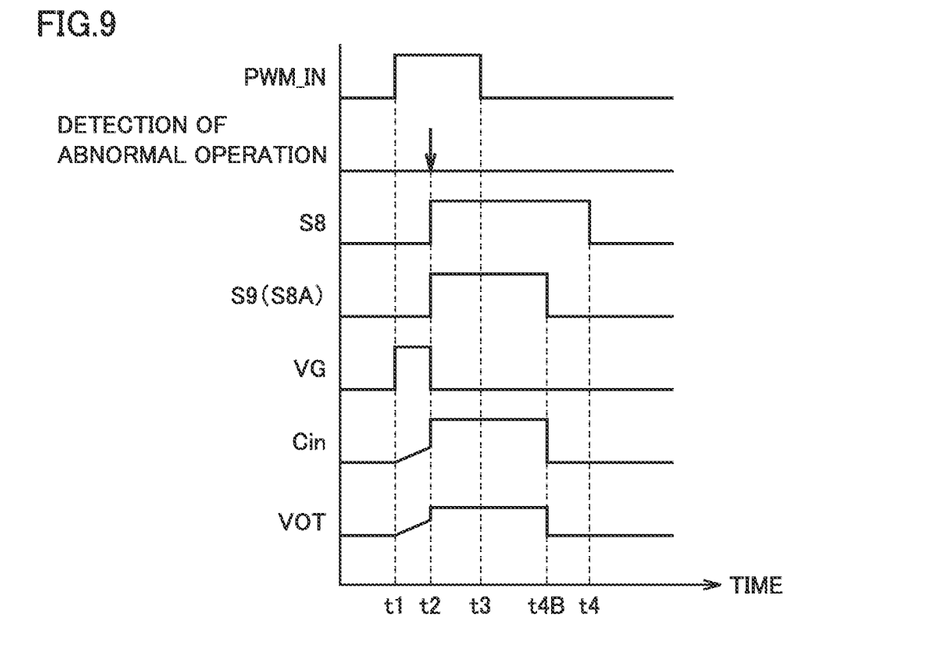
FIG. 9 is a waveform diagram illustrating an operation of a power semiconductor module according to Embodiment 3.

FIG. 9 is a waveform diagram illustrating an operation of a power semiconductor module according to Embodiment 3. Operations at times t1 to t3 in FIG. 9 are the same as those in FIG. 6, and thus description thereof will not be repeated. In FIG. 9, fault detection circuit 14A changes output blockage signal S8 from high to low at time t4, whereas fault detection circuit 14A changes an abnormal operation signal S9 (and S8A) from high to low at time t4B prior to time t4.

Application of fault signal S9 to a low impedance circuit increases power consumption of a power supply 12 for fault signal S9, consuming power irrespective of the magnitude of power used by gate driver circuit 7 to drive the gate. When fault signal S9 is output to an analog output terminal VOT as shown in FIG. 7, gate driver circuit 7 consumes significantly great power, as compared to power that gate driver circuit 7 normally consumes. Thus, reducing the activate time of fault signal S9 is effective. The sequence as shown in FIG. 9 is effective, for example, when fault signal S9 is output to the terminal, without shutting down an output driver circuit having a low impedance output terminal or when a relatively large power is required to securely output fault signal S9 to a terminal having a low external impedance of the power semiconductor module, such as a terminal PWM_IN or a terminal Cin.

Moreover, due to the fact that the fault signal has a signal width shorter than the duration in which output of power semiconductor element 1 is blocked, the amount of power consumed by a control circuit 2 which controls power semiconductor element 1 can be reduced, and the size of the circuit scale of control circuit 2 can be reduced.

Embodiment 4

Figure 10:
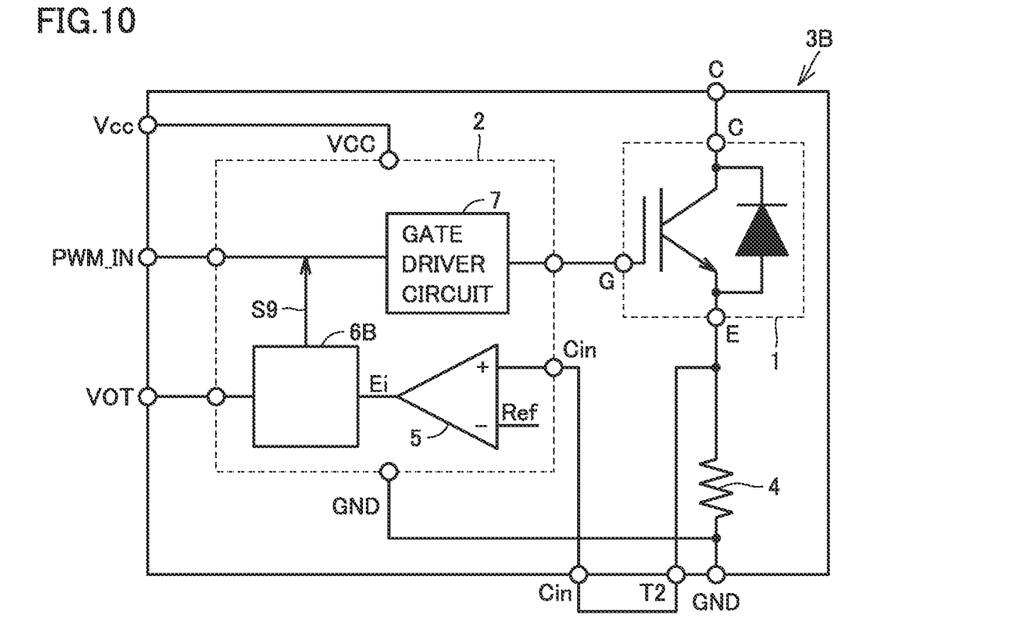
FIG. 10 is an equivalent circuit diagram illustrating a configuration of a power semiconductor module according to Embodiment 4.

FIG. 10 is an equivalent circuit diagram illustrating a configuration of a power semiconductor module according to Embodiment 4. In the configuration of Embodiment 1 shown in FIG. 3, protection circuit block 6B is configured so that terminal PWM_IN is driven by fault signal S9. By matching the polarity of an input signal of a gate driver circuit 7 and the polarity of signal S9 so that power semiconductor element 1 is off when signal S9 is activated, fault signal S9 can be shared with a blockage signal S8 for blocking power semiconductor element 1, thereby allowing elimination of cutoff gate 7G.

In this configuration, a signal related to a temperature of the power semiconductor module according to Embodiment 4 is output from a terminal VOT. In the event of a fault, the fault signal is output from a terminal PWM_IN.

Embodiment 5

In Embodiment 1, the terminal dedicated for outputting the fault signals is not necessary. However, use of terminal VOT only, for outputting the fault signals may increase the complexity of other circuits for detecting the fault signal.

Figure 11:
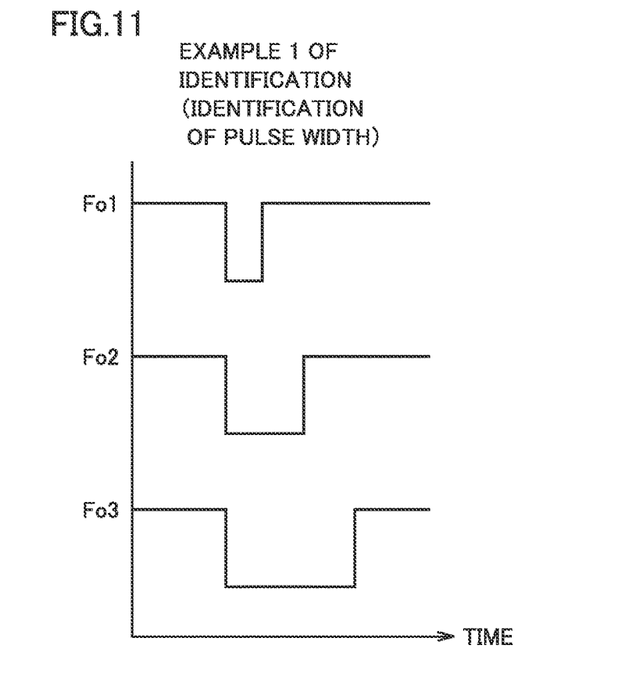
FIG. 11 is a diagram showing Example 1 of a fault signal (variations in length of the signal).
Figure 12:
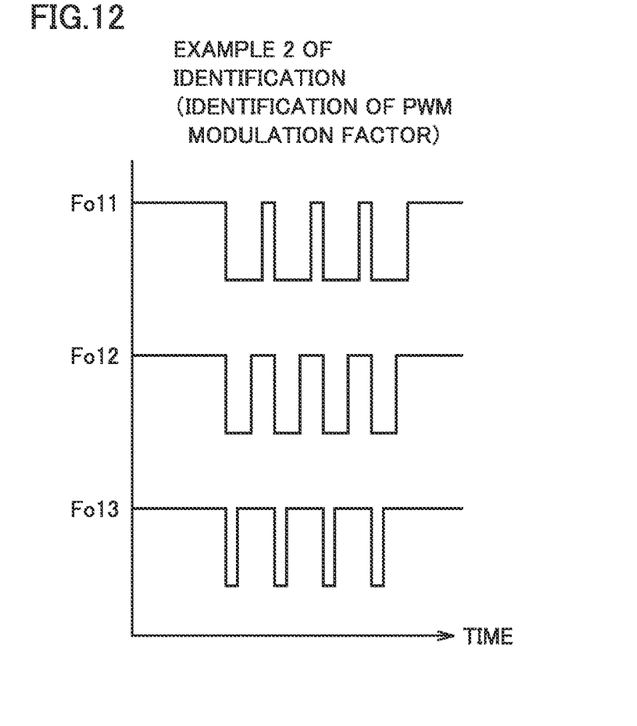
FIG. 12 is a diagram showing Example 2 of the fault signal (the signal is modulated).

As shown in FIGS. 1 and 2, the fault signal may be varied in length or modulated for each abnormal operation to identify a type of the abnormal operation or a degree of abnormality, and then output from terminal Fo. FIG. 11 is a diagram showing Example 1 of the fault signal (variations in length of the signal). Signals Fo1, Fo2, and Fo3 have different pulse widths, indicating different abnormal operations. FIG. 12 is a diagram showing Example 2 of the fault signal (the signal is modulated). Signals Fo11, Fo12, and Fo13 are pulse-width modulated (PWM) signals indicating different abnormal operations.

In order to use such fault signals, the receiving end of the signals consumes a lot of resources, such as a time measurement timer, to process the signals and immediate determination of the abnormal operation is difficult. Thus, there is need for a method for immediately identifying the abnormal operation.

Thus, the identification of the abnormal operation at the receiving end is facilitated by outputting the fault signals from multiple terminals, in addition to the shared terminal, while reserving the terminal dedicated for outputting fault signals.

Figure 13:
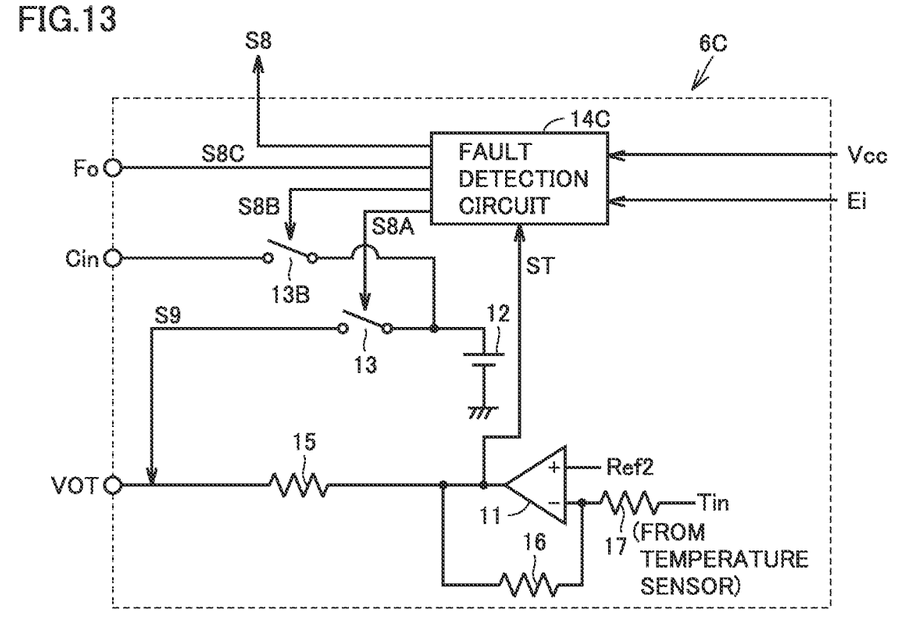
FIG. 13 is an equivalent circuit diagram illustrating a configuration of a protection circuit block 6C according to Embodiment 5.

FIG. 13 is an equivalent circuit diagram illustrating a configuration of a protection circuit block 6C according to Embodiment 5. Protection circuit block 6C shown in FIG. 13 includes a fault detection circuit 14C, instead of fault detection circuit 14 in the configuration of protection circuit block 6 shown in FIG. 4, and, additionally, includes a switch 13B for fixing a terminal Cin to high. The voltage value of a power supply 12 when it is high is a voltage value higher than the upper limit VLU, as described with reference to FIG. 5. The power semiconductor module according to this variation is provided with a terminal Fo dedicated for outputting fault signals. Besides blockage signal S8, fault detection circuit 14C outputs a signal S8A for activating fault signal S9, a signal S8B for changing terminal Cin to high, and a signal S8C for changing terminal Fo to high.

Fault detection circuit 14C is configured to: output a fault signal to only terminal Cin when fault detection circuit 14C detects, for example, overcurrent (signal Ei); output a fault signal to only a terminal VOT when fault detection circuit 14C detects an overheat fault (signal ST); and output a fault signal to terminal Fo upon a control power supply voltage Vcc drop fault. As such, using a different terminal for outputting a fault signal according to a different type of the abnormal operation allows informing of multiple types of abnormality separately, without employing a complex signal as shown in FIGS. 11 and 12, and allows identification of an abnormal operation upon output of a fault signal, without a delay.

According to Embodiment 5, use of multiple input and output terminals allows identification of faults and expands identifiable types of faults, including terminal Fo.

Embodiment 6

The present embodiment is a power converter utilizing the power semiconductor module according to Embodiments 1 to 5 described above. While the present disclosure is not limited to a particular power converter, Embodiment 6 is described below with reference to a three-phase inverter utilizing the present disclosure.

The power converter according to Embodiment 6 has the power semiconductor module according to one of claims 1 to 5, and includes a primary conversion circuit which converts input power, and a control circuit which outputs to the primary conversion circuit a control signal which controls the primary conversion circuit.

Figure 14:
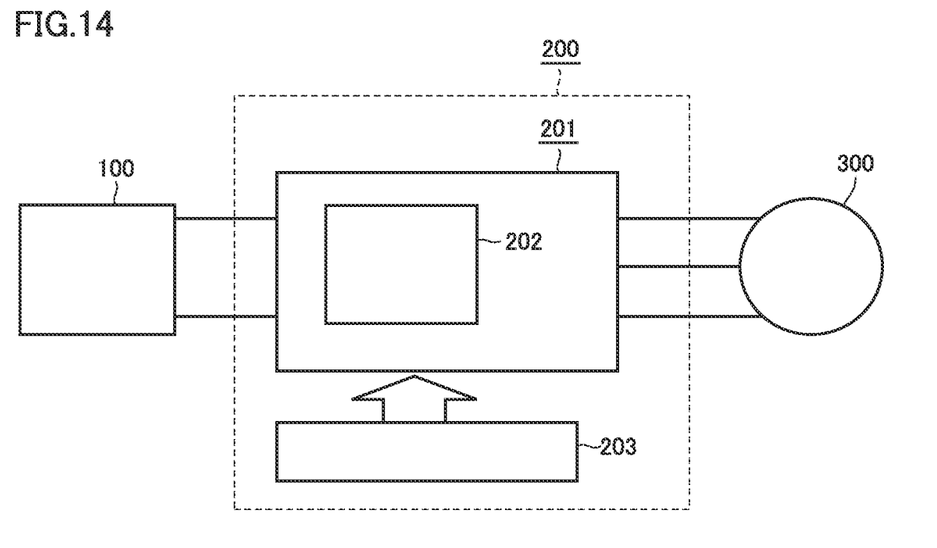
FIG. 14 is a block diagram illustrating a configuration of a power conversion system utilizing a power converter according to Embodiment 6.

FIG. 14 is a block diagram illustrating a configuration of a power conversion system utilizing the power converter according to the present embodiment.

The power conversion system shown in FIG. 14 includes a power supply 100, a power converter 200, and a load 300. Power supply 100 is a direct-current (DC) power supply, and supplies a DC power to power converter 200. Power supply 100 can include various types of power supplies. For example, power supply 100 can be a DC system, a solar battery, or a storage battery, or can be a rectifier circuit or an AC/DC converter connected to an alternating-current (AC) system. Power supply 100 may also be a DC/DC converter which converts the DC power output from the DC system into a predetermined power.

Power converter 200 is a three-phase inverter connected between power supply 100 and load 300. Power converter 200 converts the DC power supplied from power supply 100 into an AC power, and supplies the AC power to load 300. As shown in FIG. 14, power converter 200 includes a primary conversion circuit 201 which converts the DC power into AC power and outputs the AC power, and a control circuit 203 which outputs a control signal which controls primary conversion circuit 201 to primary conversion circuit 201.

Load 300 is a three-phase electric motor driven by the AC power supplied from power converter 200. Note that load 300 is not limited to a particular application, and is an electric motor mounted on various electric appliances, and is used as an electric motor for hybrid automobiles or electric automobiles, railroad vehicles, elevators, or air-conditioning equipment, for example.

In the following, power converter 200 is described in detail. Primary conversion circuit 201 includes switching elements and freewheeling diodes (not shown), and the switching elements switch and thereby primary conversion circuit 201 converts the DC power supplied from power supply 100 into AC power and supplies AC power to load 300. While there are various specific circuit configurations for primary conversion circuit 201, primary conversion circuit 201 according to the present embodiment is a three-phase two-level full-bridge circuit which can include six switching elements and six freewheeling diodes anti-parallel to the respective switching elements. The primary conversion circuit 201 includes a semiconductor module 202. The semiconductor module 202 includes the power semiconductor module according to one of Embodiments 1 to 5. Every two switching elements are connected in series, among the six switching elements, and constitute an upper or lower arm, and the upper and lower arms each configure each phase (U-phase, V-phase, W-phase) of the full-bridge circuit. Output terminals of the upper and lower arms, that is, three output terminals of primary conversion circuit 201 are connected to load 300.

Moreover, as described in Embodiments 1 to 5, a driver circuit (not shown) for driving each switching element is built in semiconductor module 202, and thus primary conversion circuit 201 includes a driver circuit.

The driver circuit generates a drive signal for driving a switching element included in primary conversion circuit 201, and supplies the drive signal to a control electrode of the switching element included in primary conversion circuit 201. Specifically, the driver circuit outputs to the control electrode of each switching element a drive signal for bringing the switching element into on-state, and a drive signal for bringing the switching element into off-state, according to the control signal from control circuit 203 described below. To maintain the switching element in the on-state, the drive signal is a voltage signal (on-signal) greater than or equal to a threshold voltage of the switching element. To maintain the switching element in the off-state, the drive signal is a voltage signal (an off-signal) less than or equal to the threshold voltage of the switching element.

Control circuit 203 controls the switching element included in primary conversion circuit 201 so that desired power is supplied to load 300. Specifically, control circuit 203 calculates a time (on-time) at which each switching element included in primary conversion circuit 201 should be in the on-state, based on power to be supplied to load 300. For example, control circuit 203 can control primary conversion circuit 201 by performing PWM control in which the on-time of the switching elements is modulated according to a voltage to be output to the switching element. Control circuit 203 then outputs a control command (the control signal) to the driver circuit included in primary conversion circuit 201 for each time point so that the on-signal is output to a switching element to be in the on-state and the off-signal is output to a switching element to be in the off-state at the time point. The driver circuit outputs the on-signal or off-signal, as the drive signal, to the control electrode of each switching element, according to the control signal.

Since the power converter according to the present embodiment utilizes the power semiconductor module according to Embodiments 1 to 5 as the switching elements and the freewheeling diodes included in primary conversion circuit 201, reduction in size of the power converter can be achieved by a reduced number of the terminals of the power semiconductor module.

The present embodiment has been described with reference to applying the present disclosure to the two-level three-phase inverter. However, the present disclosure is not limited thereto. The present disclosure is applicable to various power converters. In the present embodiment, the power converter is a two-level power converter. However, the power converter may be a three-level or multi-level power converter, and the present disclosure may be applied to a single-phase inverter to supply power to a single-phase load. The present disclosure is also applicable to a DC/DC converter or AC/DC converter to supply power to a DC load, for example.

The power converter utilizing the present disclosure is not limited to the case where the aforementioned load is an electric motor, and the power converter may be used as, for example, a power supply for an electric discharge machine or laser beam machine, or an induction heating cooking device or contactless powering system, and further may be used as a power conditioner of a photovoltaic system, electricity storage system, etc.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:
1. A power semiconductor module, comprising:
a power semiconductor element;
a control circuit configured to control the power semiconductor element; and
a first terminal which is an input terminal for applying a pulse-width modulation signal to the power semiconductor element, wherein
in an event of a fault in the power semiconductor element or the power semiconductor module, the control circuit deactivates a control electrode of the power semiconductor element, and outputs a fault signal indicating the event of the fault in the power semiconductor module from the first terminal, the fault signal is configured to have, at a time of informing a fault, a polarity matching an inactivated state of the pulse-width modulation signal; and when there is no fault in the power semiconductor element and the power semiconductor module, the control circuit uses the first terminal for other applications.

2. The power semiconductor module according to claim 1, wherein
the fault signal output from the control circuit through the first terminal has a signal width longer than a duration of the control electrode of the power semiconductor element being deactivated by the control circuit.

3. The power semiconductor module according to claim 1, wherein
the fault signal output from the control circuit through the first terminal has a signal width shorter than a duration of the control electrode of the power semiconductor element being deactivated by the control circuit.

4. A power converter comprising:
a primary conversion circuit having the power semiconductor module according to claim 1 and configured to convert input power; and
a control circuit configured to output to the primary conversion circuit a control signal which controls the primary conversion circuit.

5. A power converter comprising:
a primary conversion circuit having the power semiconductor module according to claim 2 and configured to convert input power; and
a control circuit configured to output to the primary conversion circuit a control signal which controls the primary conversion circuit.

6. A power converter comprising:
a primary conversion circuit having the power semiconductor module according to claim 3 and configured to convert input power; and
a control circuit configured to output to the primary conversion circuit a control signal which controls the primary conversion circuit.

7. A power semiconductor module, comprising:
a power semiconductor element;
a control circuit configured to control the power semiconductor element; and
a first terminal, wherein
in an event of a fault in the power semiconductor element or the power semiconductor module, the control circuit deactivates a control electrode of the power semiconductor element, and outputs a fault signal indicating the event of the fault in the power semiconductor module from the first terminal; and
when there is no fault in the power semiconductor element and the power semiconductor module, the control circuit uses the first terminal as an output terminal of an operational amplifier, wherein
a voltage of the first terminal is outside an output voltage range of the operational amplifier when the fault signal is output from the first terminal.

8. The power semiconductor module according to claim 7, wherein
the fault signal output from the control circuit through the first terminal has a signal width longer than a duration of the control electrode of the power semiconductor element being deactivated by the control circuit.

9. The power semiconductor module according to claim 7, wherein
the fault signal output from the control circuit through the first terminal has a signal width shorter than a duration of the control electrode of the power semiconductor element being deactivated by the control circuit.

10. A power converter comprising:
a primary conversion circuit having the power semiconductor module according to claim 7 and configured to convert input power; and
a control circuit configured to output to the primary conversion circuit a control signal which controls the primary conversion circuit.

11. A power converter comprising:
a primary conversion circuit having the power semiconductor module according to claim 8 and configured to convert input power; and
a control circuit configured to output to the primary conversion circuit a control signal which controls the primary conversion circuit.

12. A power converter comprising:
a primary conversion circuit having the power semiconductor module according to claim 9 and configured to convert input power; and
a control circuit configured to output to the primary conversion circuit a control signal which controls the primary conversion circuit.

* * * * *